United States Patent
Graham et al.

(10) Patent No.: US 6,197,471 B1
(45) Date of Patent: Mar. 6, 2001

(54) AMORPHOUS SILICON PHOTORECEPTOR AND METHOD FOR MAKING SAME

(75) Inventors: Marshall Donnie Graham, Nicholasville, KY (US); Gary L. Dorer, Taunton, MA (US)

(73) Assignee: Coulter International Corp., Miami, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,787

(22) Filed: Mar. 25, 1998

(51) Int. Cl.[7] .............................. G03G 5/00; C23C 14/34
(52) U.S. Cl. ................. 430/128; 430/133; 204/192.23; 204/192.26
(58) Field of Search .................. 430/128, 133; 204/192.23, 192.26

(56) References Cited

U.S. PATENT DOCUMENTS

| | | | |
|---|---|---|---|
| 4,025,339 | 5/1977 | Kuehnle | 96/1.5 |
| 4,265,991 | 5/1981 | Hirai et al. | 430/64 |
| 4,269,919 | 5/1981 | Kuehnle | 430/67 |
| 4,297,392 * | 10/1981 | Higashi et al. | 427/75 |
| 4,358,195 | 11/1982 | Kuehnle et al. | 355/4 |
| 4,428,000 | 1/1984 | Kuehnle et al. | 358/300 |
| 4,430,185 * | 2/1984 | Shimomoto et al. | 204/192 P |
| 4,451,547 * | 5/1984 | Hirai et al. | 430/133 |
| 4,533,450 * | 8/1985 | Moustakas | 204/192 S |
| 4,556,309 | 12/1985 | Weber et al. | 355/3 TR |
| 4,971,832 * | 11/1990 | Arai et al. | 430/84 |
| 5,849,455 * | 12/1998 | Ueda et al. | 430/128 |

OTHER PUBLICATIONS

Diamond, Arthur S. (editor) Handbook of Imaging Materials. New York: Marcel–Dekker, Inc. pp. 447–486, 1991.*

* cited by examiner

*Primary Examiner*—Nam Nguyen
*Assistant Examiner*—Steven H. Ver Steeg
(74) *Attorney, Agent, or Firm*—Mitchell E. Alter (57) ABSTRACT

A new photoreceptor is provided which comprises a conductive substrate and a photoconductive layer of 5 micra or less in thickness on the substrate. The photoreceptor has a dark decay greater than 20 seconds and contains less than 5% total hydrogen. The substrate is selected from the group consisting of alloys of aluminum, chromium, iron, molybdenum, nickel or tungsten. In addition, the substrate can be a nonconductive material, such as plastic, provided with an electrically conductive layer. A new method for making the improved photoreceptor comprises providing a conductive substrate and forming a photoconductive layer of 5 micra or less in thickness on said substrate by depositing an amorphous material containing silicon and hydrogen atoms wherein said substrate has a negative potential between −40 and −100 volts during the forming of said layer.

11 Claims, 2 Drawing Sheets

AMORPHOUS SILICON PHOTORECEPTOR AND METHOD FOR MAKING SAME

CROSS-REFERENCE TO RELATED APPLICATION

Reference is made to the concurrently filed, commonly assigned, U.S. application Ser. No. 09/048,149 pending, entitled "AN ENVIRONMENTALLY STABLE AMORPHOUS SILICON PHOTORECEPTOR AND METHOD FOR MAKING SAME".

BACKGROUND OF THE INVENTION

1. Field of the Invention

The present invention relates generally to electrophotographic image-forming members or photoreceptors comprising hydrogenated amorphous silicon (a-Si:H) formed onto a supporting conductive substrate. More particularly, this invention is directed to an improved a-Si:H photoreceptor and to a method for making the photoreceptor.

2. Discussion of the Prior Art

Electrophotography is a well-known image transduction art depending on the formation of an electrostatic latent image on a charge-sensitized photoconductor formed onto a suitable substrate. The latent image is typically produced by photo-induced discharge of the photoconductor in response to a light image projected onto the working surface of the photoconductor, and a visual image for transfer to the hard-copy medium is developed from the latent image by contacting it with charge-sensitive toner particles. The toned image is then the basis for a variety of further imaging processes. The versatility of electrophotography has permitted its application in systems for copying, duplicating, printing, plate making and color proofing, among others, and electrophotography is increasingly being applied in computer output devices in which lasers are used to produce the latent image. Commercial potential of such systems is directly affected by the performance and producibility of the photoconductor. Generally, the photoconductor must have good charge acceptance $V_0$ and a long dark decay $\tau_D$, typically 10 to 20 seconds at minimum. In addition, fast photo-induced discharge is required, and the spectral response of the photoconductor must be compatible with the source. In critical applications, photoconductor fatigue or residual voltage may be limiting.

Considerable effort has been expended in development of prior-art photoconductors based on inorganic materials such as cadmium sulfide, zinc oxide, or selenium, as well as organic materials such as TNF-PVCz (the reaction product of 2,4,7-trinitro-9-fluorenone and poly-9-vinylcarbazole). Some prior-art photoconductors suffer well-known disadvantages such as low charge acceptance or short dark decays, poor thermal or environmental stability, poor mechanical strength or durability, or the potential for environmental contamination. Further, others lack good adhesion properties or are otherwise incompatible with use of flexible substrates required by large-format applications such as color proofing. In addition, many require formation temperatures too high to permit their use with plastic substrates.

High-quality, large-format electrophotography can be practiced through use of microcrystalline cadmium sulfide deposited onto thin conductive substrates (U.S. Pat. Nos. 4,025,339 and 4,269,919). A metallic member, or a plastic member coated with a metallic or an ohmic layer, may form such conductive substrate. Sputtered to thicknesses of 0.3 to 5 micra onto stainless-steel roll-stock up to one meter wide and about 0.1 mm thick, such anisotropic photoconductors have been adapted to provide flexible photoreceptors for an analog color-proofing application (U.S. Pat. Nos. 4,358,195 and 4,556,309). This application required that a latent image be retained almost two minutes between photoreceptor charging and development. The large-format (approximately 50 cm by 60 cm) photoreceptors were required to be reusable for thousands of operational cycles. During operation, at 105 seconds after corona charging these thin cadmium sulfide photoconductors demonstrate typical surface potentials $V_{105}=22$ volts, they have linear photo-induced discharge, and they yield substantially zero residual voltage on complete discharge. When used with optimized liquid toner systems, these flexible low-voltage photoreceptors provide high-resolution four-color proofs. However, a potential environmental hazard due to manufacture or disposal of the cadmium sulfide photoconductor remains a concern.

The disadvantages of prior-art photoconductors has prompted investigation of amorphous silicon (a-Si) as the photosensitive material for use in electrophotographic photoreceptors. Amorphous silicon poses no environmental hazard and has good mechanical strength, adhesion, and durability, but demonstrates undesirable characteristics thought to originate in unsatisfied (or dangling) bonds in the silicon matrix. It has been shown that formation of amorphous silicon in presence of hydrogen provides a material (a-Si:H) with fewer dangling bonds and improved characteristics, the greatest improvement occurring for deposition substrate temperatures of approximately 230° C.

An extensive art based on a-Si:H materials has developed in the field of solar-energy conversion, in which thin a-Si:H layers are routinely deposited onto large-area flexible substrates; the internal resistance of such photovoltaic devices must be as low as possible (of the order of 100 ohms) for attractive power outputs, but the corresponding volume resistivities (about $10^6$ ohm·cm) result in photoconductive properties ill-suited to electrophotographic applications. Other a-Si:H materials made to have higher resistivities exhibit attractive photoconductive properties, and by appropriate doping, such a-Si:H photoconductors can be made to accept positive charging, negative charging, or charging in either polarity. However, conventional a-Si:H photoreceptors are typically directed toward rapid-imaging systems for office use, the toner systems for which may require surface potentials of 100 volts or greater but the operational cycles for which seldom require dark decays longer than a few seconds. Consequently, the prior-art a-Si:H photoreceptors (e.g., U.S. Pat. No. 4,265,991) have demonstrated several characteristics which limit their usefulness as low-voltage electrophotographic photoreceptors. Included are the following significant disadvantages:

1. The low dark volume-resistivity (about $10^{10}$ ohm·cm) of such a-Si:H photoconductors, and their resultant fast dark decays, require deposition of a high-voltage a-Si:H layer at least 10 (and usually 20 to 50) micra in thickness to achieve the surface potentials needed by many electrophotographic processes at toning; these thick photoconductive layers are both expensive to produce and poorly adapted to use with flexible substrates. As is known in the art, long dark decays require that a photoconductor have both a wide optical bandgap, which indicates a low density of thermally generated charge carriers, and a low drift mobility for such carriers. The optical bandgap of a-Si:H is known to increase with increasing hydrogen content, up to about 10% total hydrogen, and carrier mobilities in a-Si:H are known to decrease with addition of small amounts of neutral dopants such as oxygen or nitrogen. However, prior-art a-Si:H photoconductors based on either bandgap widening by hydrogen enrichment or mobility suppression by doping-induced trapping enhancement demonstrate degraded photoconductive properties and spatial inhomogeneities in the charge acceptance or toning response. In addition, the bulk properties of prior-art a-Si:H photoconductors are adversely affected by interface processes. When prior-art a-Si:H photoconductors are used in bilayer photoreceptors, carrier injection from the conductive substrate or charge transfer from the environment accelerates bulk dark-decay processes, further reducing applicability of such photoreceptors. Such processes have been partially overcome in the prior art by fabrication of multilayered photoreceptors in which thin (a few hundred nm or less) insulating layers are either deposited at the interface between the a-Si:H photoconductor and the conductive substrate, or topcoated over the photoconductor, or both.

2. Charge injection or impurity migration into the adherent surface of the photoconductor has been particularly limiting for a-Si:H photoconductors formed onto many conductive substrates. In the prior art, thin blocking or barrier layers are commonly deposited on the substrate surface prior to formation of the a-Si:H photoconductor; both electrically insulating and less-reactive conductive materials have been used. Yet another approach has been to use the a-Si:H photoconductor as a charge-generation layer and couple it with another layer which acts as a charge-transport layer. These multilayered photoreceptors are complicated to process, costly to produce, and still require a-Si:H layers at least 10 (and typically 20 to 50) micra thick to achieve practical surface potentials at toning; in addition they are inflexible and difficult to manufacture in the large formats required for electrophotographic applications such as analog or digital color proofing.

3. Electrophotographic properties of a-Si:H photoconductors degrade on exposure to environmental humidity or to reactive species present during charging. This sensitivity is thought to originate in unsatisfied dangling bonds on the surface of the a-Si:H photoconductor, as well as on surfaces of internal structural inhomogeneities accessible to active species. In the prior art, such sensitivity has been decreased by overcoating the a-Si:H photoconductor with a thin (of the order of 10 to 200 nm thick) electrically insulating topcoat such as silicon nitride, silicon carbide, or silicon dioxide; however, such prior-art topcoatings add cost, typically require a separate deposition step, and may give rise to an undesirable residual voltage unless kept ineffectually thin.

These disadvantages typify prior-art a-Si:H photoconductors prepared by either silane-based glow discharge or reactive sputtering based on admixed hydrogen in the sputtering atmosphere. Both preparative methods have been used to deposit prior-art a-Si:H photoconductors onto metal substrates, usually at substrate temperatures of 250° C. or greater. Glow-discharge methods have yielded the best prior-art a-Si:H photoconductors, but deposition rates are low and even further limited if dark resistivities of the order of $10^{10}$ ohm·cm are to be obtained. In addition, damaging reactions between process gases and plastic substrates preclude deposition of a-Si:H photoconductors onto such substrates by glow discharge methods.

Prior-art methods for making a-Si:H photoreceptors yield poor results when used at low substrate temperatures. As has been noted, the prior-art a-Si:H photoconductors having the best properties were made by silane-based glow-discharge processes; these deposit $SiH_x$ species onto the substrate, with bonding of the Si atoms and diffusion and evolution of excess hydrogen. Under optimum conditions, a-Si:H layers with low non-monohydride content results, but at low substrate temperatures polysilane layers are likely to result. In contrast, photoconductive layers made by sputtering processes are built up by deposition and fusion of Si atoms removed from the target, simultaneously with hydrogenation due to the sputtering atmosphere. Under prior-art sputtering conditions, such processes tend to produce SEM-resolvable columnar microstructure, which at low substrate temperatures results in low-density layers of particularly poor photoconductive qualities.

Sputtering methods can achieve deposition rates several times greater than are currently available by glow-discharge processes and thus promise greater commercial utility. Unfortunately, the a-Si:H photoreceptors prepared by prior-art radio-frequency (RF) reactive-sputtering practices suffer especially from the above-listed disadvantages, and it is known that a-Si:H photoreceptors sputter-deposited at substrate temperatures below about 250° C. have particularly poor properties and stability. At such substrate temperatures, sputtering conditions favor several mechanisms considered to be deleterious to a-Si:H photoreceptor performance:

1. Both the density and refractive index of such a-Si:H photoconductors are notably less than that for crystalline silicon, both decreasing as the substrate temperature at deposition is decreased. It is widely accepted that these effects are due to both formation of microvoids in the photoconductor and segregation of electronically detrimental non-monohydrides and contaminants on the surfaces of such voids.

2. Bonding of hydrogen in non-monohydride modes is favored, with probable concentration in the voids and attendant instability in photoconductor properties.

3. Prior-art a-Si:H photoreceptors formed at substrate temperatures of less than about half of silicon's melting temperature are known to exhibit scanning electron microscope (SEM)-resolvable columnar growth structure 10 to 100 nm in diameter; the columns are separated by interstices due to incomplete coalescence of nucleation islands. Columnar interstices originate at the substrate and propagate through the photoconductor thickness. They not only decrease photoconductor density and refractive index, but also act as segregation surfaces, and serve as diffusion channels for reactive species, so degrading photoconductor properties through increased environmental sensitivity. Such interstitial effects can dominate bulk properties of the columns, particularly in thin layers, and are widely thought to account for the poor electrophotographic performance of prior-art photoreceptors incorporating a-Si:H photoconductors. These effects are particularly limiting if the photoreceptor comprises a thin a-Si:H layer deposited onto a conductive substrate.

It is known that substrate potential during a-Si:H deposition can significantly influence both the structural and compositional homogeneity of the a-Si:H layer being deposited. It is also known that the greater mobility of electrons in the plasma causes conductive substrates to spontaneously develop an uncontrolled negative potential (self-bias) relative to the plasma and apparatus structure that is dependent on the deposition conditions. In RF sputtering apparatus, the magnitude of the self-bias so developed depends most directly on the partial pressure of argon ($P_{Ar}$) in the sputtering atmosphere, on the ratio of the effective areas of substrate and target, and on the target voltage $V_T$ established by the diode action on applied RF power. Substrate self-bias is commonly controlled by varying target voltage $V_T$, which also affects the a-Si:H deposition rate $R_{Si}$. For prior-art sputtering conditions, maximum substrate self-bias potentials are approximately −20 volts, and reduction of target voltage to vary the self-bias potential reduces $R_{Si}$. Thus, control of substrate self-bias by varying target voltage $V_T$ is counterproductive when high deposition rates are desired.

An external positive bias potential has been applied to the substrate (relative to the apparatus structure) to minimize bombardment of the developing a-Si:H layer by $Ar^+$ and $Si^+$ ions, but this approach results in increased electron bombardment, heating of the developing a-Si:H photoconductive layer, and probable damage to plastic substrate materials. An external negative bias potential has been applied to the substrate, to limit electron bombardment and consequent heating of the a-Si:H layer; however, this results in hydrogen etching of the developing a-Si:H layer, in back sputtering of the a-Si:H layer by $Ar^+$ ions, or in increased incorporation of argon into the a-Si:H layer, all mechanisms considered in the prior art to result in undesirable structural and compositional inhomogeneity through said layer. Such prior-art external bias potentials are typically applied without apparent consideration of the level of substrate self-bias and are limited to a magnitude of approximately 20 volts measured at the voltage source. Any beneficial effect of bias current on photoconductor properties is unrecognized in the prior art. Photoreceptors comprising a-Si:H layers sputtered under prior-art bias conditions demonstrate dark decays too rapid for use in many electrophotographic applications and particularly so for those requiring thin photoconductive layers.

Because of the poor electrophotographic properties demonstrated by prior-art a-Si:H photoreceptors, and particularly for those sputtered at substrate temperatures below 200° C., there is a need for an improved a-Si:H photoconductor depositable by reactive sputtering methods. Moreover, prior-art sputtering methods preclude use of plastic substrates, which offer advantages in many electrophotographic applications but which may deform unacceptably at substrate temperatures greater than approximately 130° C. In general, photoconductor deposition at substrate temperatures of approximately 130° C. would result in significantly fewer thermal defects in the photoconductor, in decreased cooling stress between the photoconductor and its substrate, and in significantly lower process energy costs, all of which are advantageous for commercial production of a-Si:H photoreceptors.

Thus, it is desirable to provide an improved a-Si:H photoconductor which, in thicknesses of five micra or less, retains sufficient surface potential to permit effective toning of its latent image in practical electrophotographic processes; minimum dark decays of 20 seconds are required, while dark decays of two minutes or more are needed in many applications, particularly in digital ones using lasers to write large-format optical images. It is desirable that the method provide deposition of such a-Si:H photoconductors at significantly lower substrate temperatures than are used for prior-art a-Si:H photoconductors, so that plastic substrates may be used. It is desirable that the photoconductor exhibit minimal growth in the columnar habit, so that interstitial segregation and diffusion effects on its electrophotographic properties and their stability can be limited. It is further desirable that the photoconductor be directly depositable onto flexible conductive substrates, to which it should be firmly adherent.

It is also desirable to provide an improved method for forming the improved a-Si:H photoconductor and incorporating it into electrophotographic photoreceptors. It is desirable that such method be capable of depositing photoconductors of uniform spatial properties onto large-format flexible substrates. It is desirable that no blocking or barrier layers be required between the photoconductor and the conductive substrate. It is desirable that the forming method be practicable at significantly lower substrate temperatures than are prior-art sputtering methods, so that plastic substrates may be used. It is desirable that critical process parameters of the forming method be amenable to control. It is desirable that the forming method permit doping of the a-Si:H photoconductor, as well as deposition of an insulating topcoat onto it, if desired.

To address the first two above-listed disadvantages of prior-art a-Si:H photoconductors, a novel photoconductor and method have been developed. To address the third of the above-listed disadvantages, a cost effective method for stabilizing properties of a-Si:H photoreceptors in high-humidity environments is disclosed in the above cross-referenced related application, which is herein incorporated by reference. Said stabilization method is usable with the present invention and comprises a surface treatment of the photoconductor with a silanol-rich prepolymer, a rinse with water, and a heat treatment as therein described.

SUMMARY OF THE INVENTION

In view of the foregoing discussion, an important object of the invention is to provide a novel a-Si:H photoreceptor, said photoreceptor having an improved dark decay $\tau_D$ and good spatial uniformity when formed as a layer 5 micra or less in thickness at low substrate temperatures. According to the present invention, there is provided a improved photoreceptor by a conductive substrate and a photoconductive layer of 5 micra or less on said substrate, said photoconductive layer containing silicon and hydrogen atoms.

Another object of this invention is to provide a novel method of making the improved a-Si:H photoreceptors. The present inventive method comprises making a photoreceptor member comprising providing a conductive substrate and forming a photoconductive layer of 5 micra or less on said substrate by depositing an amorphous material containing silicon and hydrogen atoms wherein said substrate has a negative potential between −40 and −100 volts during the forming of said layer.

The invention and its advantages will be better understood from the ensuing description of preferred embodiments, reference also being made to the accompanying drawings.

DETAILED DESCRIPTION OF PREFERRED EMBODIMENTS

A new a-Si:H photoreceptor comprises an a-Si:H photoconductor deposited directly onto a conductive substrate, without an intermediate charge-injection blocking or barrier layers of prior-art a-Si:H photoreceptors. The photoreceptor can comprise flexible substrates of metal or plastic provided with a conductive layer, to either of which the new a-Si:H photoconductor is strongly adherent. Due to the low temperatures used during the deposition process, plastic substrates remain substantially unaffected by deposition of the novel photoconductor. It is preferred that said photoreceptor have spatially uniform charge acceptance $V_0$, have a spatially uniform dark surface potential greater than 10 volts for approximately two minutes after charging, and have good photo-induced discharge properties. Preferably the photoconductive layer is formed at substrate temperatures below the normalization temperature of Mylar®, about 200° C.

The novel photoconductor does not demonstrate the marked columnar microstructure typical of prior-art a-Si:H photoconductors formed at substrate temperatures below 250° C., but instead demonstrates a homogeneous glass-like appearance when examined by scanning electron microscopy (SEM). Useful electrophotographic properties are attained for photoconductor thicknesses on the order of one micron, at deposition rates of approximately one micron/hour. Deposited to thicknesses of five micra or less, the new photoconductor yields photoreceptors which exhibit a long dark decay $\tau_D$, good charge acceptance $V_0$, and good panchromatic photosensitivity. Deposited onto flexible metallic substrates, the new photoconductor demonstrates excellent durability and yields high-resolution, high-quality images useful in various electrophotographic applications such as printing, plate making, duplicating, or color proofing, among others. In ambient relative humidities below about 40%, dark decays of the new a-Si:H photoreceptors are spatially uniform. The new a-Si:H photoreceptor can include a thin insulating topcoat on the outer surface of the photoconductor or the outer surface may be chemically altered as disclosed in the cross-related application, or both, to environmentally stabilize the electrophotographic properties of the photoconductor for use in higher ambient humidity.

Through use of novel substrate bias conditions and by controlling hydrogen incorporation during formation of the photoconductor in radio-frequency diode reactive sputtering apparatus (hereinafter referred to as RFSA), a method has been developed for producing an a-Si:H photoconductor material which exhibits characteristics not known in the a-Si:H art. In the method of the invention, an external direct-current (DC) substrate power source is electrically connected between the otherwise insulated conductive substrate in a radio-frequency (RF) diode reactive-sputtering apparatus, the substrate support of which is caused to maintain the substrate at a selected temperature. The photoreceptor substrate is caused to assume a minimal negative bias potential (relative to the apparatus structure), and contrary to the prior art, a minimal bias current based on target area is caused to flow during the formation of the photoconductive layer. The rate of hydrogen incorporation into the developing a-Si:H layer is controlled by regulating the ratio $(P_H/R_{Si})$ of the partial pressure of hydrogen $(P_H)$ in the sputtering atmosphere to the a-Si:H deposition rate $(R_{Si})$ during formation of the photoconductive layer.

It has been found that for appropriate rates of hydrogen incorporation, the dark resistivities and dark decays $\tau_D$ of the photoconductive layer can be increased and made consistent, for minimal substrate bias potentials of approximately −40 volts or greater and minimal DC bias current densities of approximately 0.70 A/m² of target area. In contrast to prior-art a-Si:H photoconductors, the new photoconductor contains only about 4% total hydrogen which, due to reduced diffusion at the low formation temperatures, is more uniformly distributed throughout the thickness of the photoconductor. In further contrast to the prior art, it has been found that DC substrate bias potentials of approximately −80 volts relative to the apparatus structure, with DC bias current densities in the approximate range between 0.70 A/m² and 3.20 A/m² of target area, give dramatic and unexpected increases in the dark resistivities and dark decays $\tau_D$ of such photoconductive layers. These findings permit a-Si:H photoreceptors with identical bandgaps and dark decays to be produced over a range of target RF power densities (provided that the ratio of $P_H$ to $R_{Si}$ is kept constant), as well as permit the RF power supplied to the sputtering target to be increased to near-breakdown levels if desired, to maximize deposition rates of the improved a-Si:H photoconductor. The inventive method may be adapted to use with magnetron techniques, although these are not required for practice of the method.

The optical bandgap of the photoconductive layer in these novel a-Si:H photoreceptors, and therefore the density of thermally generated carriers in the photoconductive layer, can be controlled over the range between 1.7 eV and 2.1 eV by regulating the ratio $(P_H/R_{Si})$ over the approximate range between 2.80 mTorr·hr/micron and 5.80 mTorr·hr/micron during formation of the photoreceptors. The drift mobilities of free charge carriers in the photoconductive layer can be decreased and repeatably controlled, by controlling the substrate bias conditions as stated above, to provide a carrier mobility·lifetime product of at least $10^{-10}$ cm²/volt. Through controlling both the density and mobility of the thermally generated carriers in the photoconductive layer, dark resistivities greater than $10^{13}$ ohm·cm are readily achieved. Surface potentials of approximately 17 volts at 105 seconds after charging have been demonstrated for bilayer photoreceptors comprising a photoconductive layer approximately 1.0 micron in thickness on stainless-steel substrates, while surface potentials of approximately 24 volts at 300 seconds after charging have been attained for similar photoreceptors comprising a 1.4-micra thick photoconductive layer and a silicon nitride topcoat 10 nm in thickness. In contrast to the prior art, the a-Si:H photoconductor made according to the method of the invention attains its significantly greater dark decay with neither the doping nor the alloying used to improve dark resistivities of prior-art a-Si:H photoconductors. The new a-Si:H photoconductor may, however, be doped to provide bichargeable characteristics.

It has been further found that deleterious electronic effects associated with prior-art a-Si:H formation at low substrate temperatures can be limited and that novel a-Si:H photoreceptors can be produced which lack the marked columnar microstructure typical of prior-art a-Si:H photoconductors formed at substrate temperatures below 250° C. Moreover, It has been found that an a-Si:H photoconductor having the required spatially-uniform dark decays $\tau_D$ can be made at substrate temperatures between 80° C. and 200° C., more preferably between 100° C. and 180° C., with little dependence of the photoconductive properties on deposition temperature within this range. In contrast to prior-art a-Si:H photoconductors, the new photoconductor contains less than 5% and preferably less than 4% total hydrogen, and due to reduced diffusion of hydrogen at the low formation temperatures, the distribution of hydrogen is more uniform throughout the thickness of the photoconductors than in prior-art a-Si:H photoconductors. The a-Si:H layers formed according to the inventive method contain between less than 7% and preferably less than 6% implanted argon, are strongly adherent to the deposition substrate, and when formed onto flexible substrates, provide flexible dopable photoreceptors which can be readily produced in square-meter formats. When appropriate flexible metallic substrates are used, such photoreceptors may be made by a single deposition process.

Using the new bias-sputtering method, a novel a-Si:H photoconductors of electrophotographic quality have been formed directly onto conductive substrates held at temperatures as low as 80° C. and preferably as low as 100° C. Useful photoconductive properties are attained for a-Si:H thicknesses on the order of one micron, at deposition rates of approximately one micron/hour. For relative humidities below about 40%, these photoreceptors were found to yield high-resolution, high-quality images when used with imaging processes and liquid toning systems compatible with cadmium sulfide photoreceptors. Photoreceptors made by the inventive method are usable over many operational cycles. Due to the low temperatures used in the new method, plastic substrates supporting a conductive or ohmic layer are substantially unaffected by the a-Si:H deposition process.

To practice the present invention, the method hereinafter described is preferably used to form the new a-Si:H photoconductor directly onto conductive substrates, without intermediate blocking or barrier layers.

Photoreceptor Embodiment 1

Figure 1:
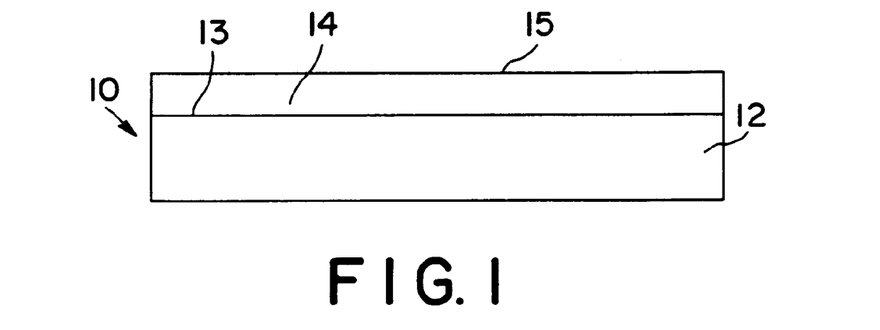
FIG. 1 is a schematic cross-sectional view of a bilayer photoreceptor embodying the present invention.

With reference to FIG. 1, a first embodiment of an a-Si:H photoreceptor incorporating the present invention is designated generally by the reference numeral 10. The photoreceptor 10 comprises a substrate 12 having a conductive surface 13 and a photoconductive layer 14 of a-Si:H formed onto conductive surface 13. Substrate 12 may be any structure suited to a given electrophotographic application and may be made of either an electrically conductive material having an inherently conductive surface 13 such as a sheet made from alloys of aluminum, chromium, iron, molybdenum, nickel, and tungsten, or a nonconductive material provided with an electrically conductive layer forming surface 13, such as a Mylar® film provided with a conductive layer selected from the group consisting of alloys of aluminum, chromium, iron, molybdenum, nickel, and tungsten. In addition, the substrate 12 can be a nonconductive material, such as plastic, provided with an electrically conductive layer forming surface 13, such as ohmic oxides. Conductive surface 13 must be smooth and free of defects or flaws to the degree consistent with the desired electrophotographic resolution, and it is preferred that surface 13 be a clean, nonreactive surface.

When a-Si:H photoreceptors 10 are formed on clean, nonreactive substrates 12, long dark decays are readily attained through the inventive method without need for intermediate charge-injection blocking or barrier layers. Some substrate materials can result in excessive charge-injection effects or in migration of impurities from the surface 13 into the a-Si:H layer during the sputtering process or during use, with consequent degradation of photoreceptor response or spatial uniformity. For example, both copper and gold are known in the art to result in poor photoreceptor performance when used as substrates, while aluminum alloys might give less consistent performance than alloys containing various amounts of chromium, iron, molybdenum, nickel, or tungsten. If less-preferable materials are used as photoreceptor substrate 12, blocking or barrier layers of the many types known in the art may be applied to substrate surface 13 prior to the formation of the a-Si:H photoconductive layer 14. However, it is preferable that nonreactive substrates be used, and stainless steels are preferred for their functionality, low cost, and ready availability. With a preliminary cleaning to remove surface contaminants and a presputtering period in the process reactor to prepare an atomically clean surface, the stainless steels form rugged flexible substrates to which the photoconductive layer is strongly adherent.

For large-format photoreceptors such as are used in color proofing, surface 13 is preferably one surface of a thin stainless-steel sheet of appropriate lateral dimensions, said sheet forming substrate 12. Type 301 stainless steel 0.1 mm thick and Type T430 stainless steel 0.125 mm thick have both performed well as substrate materials when provided with mirror finishes. Other large-format applications may benefit from use of a Mylar® polyester film provided with a suitable conductive thin layer (e.g., of a non-reactive metal such as chromium or of a transparent ohmic oxide of indium or tin or combinations thereof) comprising surface 13; such layer may be either formed as a preliminary step while the plastic substrate is in the RF sputtering apparatus or as a separate precursor step by any of the methods known in the art. Photoreceptor substrates for smaller-format applications can be rigid or non-planar, and as known in the art, a wide variety of materials and geometries can be adapted to use as substrates.

The a-Si:H photoconductive layer 14 is preferably formed directly onto conductive surface 13 of substrate 12 to a thickness of five micra or less using bias RF reactive sputtering as hereinafter described. Most preferably, photoconductive layer 14 is formed to a thickness between 0.3 micron and 3 micra. A photoconductor thickness of approximately one micron provides a reasonable compromise between maximizing energy coupling efficiency and minimizing the volume contribution to the available thermally generated carriers in the photoconductor layer. The optical bandgap of such photoconductive layers, and therefore the density of thermally generated carriers, can be controlled over the range between 1.7 eV and 2.1 eV by regulating the ratio of ($P_H/R_{Si}$) of the partial pressure of hydrogen ($P_H$) in the sputtering atmosphere to the a-Si:H deposition rate ($R_{Si}$) over the approximate range between 2.8 mTorr·hr/micron and 5.8 mTorr·hr/micron during formation of the photoreceptors. The drift mobilities of free charge carriers in the photoconductive layer can be decreased and repeatably controlled, by controlling the substrate bias conditions as stated above, to provide a carrier mobility-lifetime product of at least $10^{-10}$ cm$^2$/volt. Through controlling both the density and mobility of the thermally generated carriers in the photoconductive layer, dark resistivities greater than $10^{13}$ ohm·cm are readily achieved, with correspondingly long dark decays $\tau_D$. For a-Si:H layers 14, one micron in thickness, deposited at rates of approximately one micron/hour, the new photoreceptors have charge acceptances $V_0$=−40 volts and can maintain dark electric field strengths E>10 volts/micron between the outer surface 15 and conductive surface 13 for more than 100 seconds, preferably greater than 200 seconds. As discussed in Method Embodiment 5, approximate dark surface potentials of −17 volts at 105 seconds after charging have been demonstrated for undoped bilayer photoreceptors comprising a-Si:H layers approximately 1.0 micron in thickness on stainless-steel substrates, or $E_{105}$≅17 volts/micron. These significantly greater dark decays are attained without either the doping or the alloying used to improve dark resistivities of prior-art a-Si:H photoconductors.

In ambient relative humidities below about 40%, dark decays of the new low-voltage a-Si:H photoreceptors are spatially uniform. However, as with prior art a-Si:H devices, photoreceptor 10 has an outer surface 15 which demonstrates a spatially nonuniform charge acceptance and toning response at ambient relative humidities of about 40% and higher, resulting in spatially erratic electrophotographic behavior. It was discovered that surface 15 can be environmentally stabilized by chemically altering it with a liquid silanol-rich prepolymer, rinsing, and heat treating as disclosed in the above-referenced related application, incorporated herein by reference.

Photoreceptor Embodiment 2

The new a-Si:H photoconductors may be doped to provide bichargeable characteristics, preferably by appropriate introduction of a suitable dopant gas into the sputtering atmosphere during deposition of the a-Si:H photoconductive layer 14. As discussed in Method Embodiments 4, 6 and 7, concentrations of diborane ($B_2H_6$) at levels as low as 0.1 ppm substantially increase the bichargeability of the new a-Si:H photoreceptors. Depending on the desired characteristics, concentrations of approximately one ppm to 15 ppm of diborane are preferred. With Method Embodiment 4 surface potentials of approximately −14 volts at 105 seconds after charging have been demonstrated for doped bilayer photoreceptors comprising a-Si:H layers approximately 1.0 micron in thickness, or $E_{105} \equiv 14$ volts/micron. As appreciated by those skilled in the art, gases containing other elements, from the IIIA or VA groups of the periodic table of elements, can also be used. One such example is a gas containing phosphorous. If less-preferable materials are used as photoreceptor substrate 12, blocking or barrier layers of the many types known in the art can be applied to substrate surface 13 prior to the formation of the a-Si:H photoconductive layer 14. The method of the above-referenced related application can also be used on the outer surface 15 of doped photoconductor 14.

Photoreceptor Embodiment 3

Figure 2:
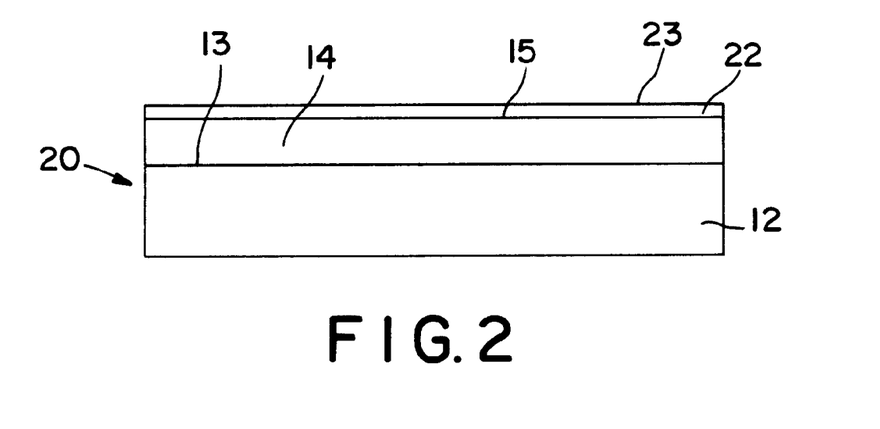
FIG. 2 is a schematic cross-sectional view of a photoreceptor embodying the present invention and having a topcoat.

Alternatively, the outer surface 15 of a-Si:H photoconductor 14 in either of the above-described embodiments can be environmentally stabilized by providing a thin electrically insulating topcoat, as discussed in Method Embodiments 5, 6 and 7. With reference to FIG. 2 (wherein reference numbers 12, 13, 14, and 15 have the same meaning as for FIG. 1), another embodiment of an a-Si:H photoreceptor incorporating the present invention is designated generally by the reference numeral 20. Topcoat 22 formed on surface 15 can be any of the dielectric materials known in the art, formed either as a secondary step while the photoreceptor 20 is in the sputtering apparatus or by other methods known to those skilled in the art. Preferably, to reduce contamination of the sputtering apparatus, the topcoat is one of the silicon dielectrics, e.g., silicon nitride, silicon dioxide, or silicon carbide. The topcoat is preferably formed to a thickness of only 5 to 15 nm, since residual voltages become excessive for thicknesses of such topcoats greater than about 20 nm. With Method Embodiment 5 surface potentials of approximately −28 volts at 105 seconds after charging have been demonstrated for photoreceptors comprising undoped a-Si:H layers approximately 1.0 micron in thickness ($E_{105} \equiv 28$ volts/micron), while with Method Embodiment 7 surface potentials of approximately −24 volts at 300 seconds after charging have been attained for photoreceptors comprising boron doped a-Si:H layers approximately 1.4 micra in thickness (Series D; $E_{300} \equiv 17$ volts/micron), each topcoated with silicon nitride 10 nm in thickness. The method of the above-referenced related application may also be used on the outer surface 23 of topcoat 22 if desired, and such can be particularly advantageous if the thickness of topcoat 22 must be minimized. If less-preferable materials are used for photoreceptor substrate 12, blocking or barrier layers of the many types known in the art can be applied to said substrate prior to the formation of the a-Si:H photoconductive layer 14.

Method Embodiments

The a-Si:H photoconductive material (14 in FIGS. 1 and 2) and photoreceptors (10 or 20 in FIG. 1 or 2, respectively) incorporating the photoconductive material are formed at low substrate temperatures using the method of the present invention with RFSA. The inventive method includes novel substrate bias conditions and control over hydrogen incorporation during sputter-deposition of the photoconductor, whereby both the density and the effective mobility of thermally generated carriers in the photoconductive layer are reduced to provide long photoconductor dark decays.

In many sputtering methods, an external temperature-control means is used to regulate the temperature of the conductive support on which substrate 12 (in FIGS. 1 and 2) is mounted during deposition of a-Si:H layer 14. However, in the method of the present invention, the conductive substrate support of a RFSA is caused to maintain substrate 12 at a selected temperature in a range found to be disadvantageous in the prior sputtering art, i.e., between 80° C. to 200° C. The preferred substrate temperature is in the range between 100° C. to 180° C., with the lower temperatures generally being most preferred.

An external direct-current (DC) substrate power source is electrically connected between the chamber structure of the RFSA and the otherwise-insulated substrate support to which conductive substrate 12 is electrically connected, whereby substrate 12 is caused to assume a negative potential relative to the plasma and apparatus structure. The method of the present invention differs from prior-art bias sputtering in two important ways. First, sputtering parameters are preferably selected to provide a self-bias potential relative to the apparatus structure for substrate 12 which is as close to zero as is consistent with the desired rate of hydrogen incorporation, so that the actual substrate potential $V_B$ is at least partially decoupled from its usual dependence on sputtering parameters and made to be substantially that potential established by the external DC power source. The prior art has only considered the substrate potential and ignored the impact of the substrate current density. Second, it has been discovered that for appropriate rates of hydrogen incorporation and DC substrate bias potentials between approximately −50 volts and −100 volts, a-Si:H photoreceptors 10 or 20 having useful dark resistivities and dark decays can be formed by RF bias reactive sputtering if DC bias current densities are maintained in the range between 0.50 $A/m^2$ and 3.5 $A/m^2$, and preferably from 0.7 $A/m^2$ and 3.2 $A/m^2$, and most preferably 0.9 $A/m^2$ and 2.7 $A/m^2$ of target area. Specifically, it has been discovered that DC substrate bias potentials in the preferred range between approximately −70 volts and −90 volts, together with DC bias current densities in the most preferred range between 0.90 $A/m^2$ and 2.70 $A/m^2$, results in decreased drift mobilities and an effective carrier mobility-lifetime product of at least $10^{-10}$ $cm^2/volt$ for free charge carriers in the a-Si:H photoconductor 14. Consequently, dramatic and unexpected increases in the dark resistivities and dark decays of such a-Si:H photoreceptors are provided over a practical range of low-temperature sputtering conditions. These findings permit a-Si:H photoreceptors 10 or 20 having identical bandgaps and dark decays to be produced over a range of target RF power densities (provided that the ratio of $P_H$ to $R_{Si}$ is kept constant), as well as permit the RF power supplied to the sputtering target to be increased to near-breakdown levels to maximize deposition rates of the improved a-Si:H photoconductor 14. Preferably the deposition of the a-Si:H is performed having a target voltage greater than 90% of the breakdown voltage.

In the present method the rate of hydrogen incorporation into the a-Si:H photoconductive layer 14, and thereby the optical bandgap $E_g$ and density of free charge carriers therein, is controlled by regulating the ratio $(P_H/R_{Si})$ of the partial pressure of hydrogen $(P_H)$ in the sputtering atmosphere to the a-Si:H deposition rate $(R_{Si})$ during deposition of a-Si:H layer 14 onto the conductive surface 13 of substrate 12. Such regulation has been demonstrated over the range of bandgaps between 1.7 eV and 2.1 eV. The preferred range for $E_g$ is between 1.9 eV and 2.1 eV, and the preferred range for $(P_H/R_{Si})$ is between 2.8 mTorr·hr/micron and 5.8 mTorr·hr/micron. Photoconductive layer 14 deposited according to the present method contains only about 4 atomic percent (at%) total hydrogen (atomic percent is the percentage of the number of hydrogen atoms divided by the sum of hydrogen and silicon atoms times one hundred), and due to reduced diffusion of hydrogen at the low formation temperatures, distribution of the hydrogen is more uniform throughout the thickness of the photoconductive layer. The argon content of photoconductive layer 14 is in the range of 4 at% to 6 at%.

Through additional control over both the density and mobility of the thermally generated carriers in the photoconductive layers 14, dark resistivities greater than $10^{13}$ ohm·cm and correspondingly long dark decays are readily attainable. The new method depends on neither the doping nor the alloying used to improve dark characteristics of prior-art a-Si:H photoconductors. Except for requiring that the substrate support be electrically isolated from the apparatus structure and connected to an external electrical DC power source, the inventive method places no particular requirements on the sputtering apparatus beyond those known in the sputtering art to constitute good sputtering practice. The inventive method may be adapted to use with sputtering apparatus incorporating magnetron techniques, although these are not required for practice of the method.

By way of example, the inventive method will be described as implemented for both a laboratory RFSA and a large-scale production RFSA. With both, presputtering was done to assure steady-state chamber conditions of the desired type, as well as, to clean the substrate surface and ensure good adhesion of the a-Si:H layer. Both RFSA were equipped with roll-to-roll capability for transporting continuous substrates around a rotating substrate support drum, but to facilitate development of the inventive method, both were operated with discrete substrates fixed to the support drum. To produce significant quantities of the new a-Si:H photoreceptors, either RFSA would be operated in a roll-to-roll mode. It is believed that the examples will enable one skilled in the radio-frequency sputtering arts to adapt the inventive method to other specific sputtering apparatus and to other operational modes.

Similarly, to aid development and to better characterize the new a-Si:H photoconductor material, witness samples for use in optical and infrared evaluations were formed on a 2.54-cm square of Corning #7059 glass and on a wafer of crystalline silicon 2.54-cm in diameter, both fixed to the photoreceptor substrates 12. The witness samples deposited onto Corning #7059 glass were used to evaluate the thickness of the a-Si:H layer 14, its refractive index at 1.3 micra wavelength, and its optical bandgap. These parameters were determined from analysis of transmission and reflection spectra over the visible and near-infrared wavelengths. The witness samples deposited onto crystalline silicon were evaluated by infrared transmission spectroscopy, to determine the modes of Si:H bonding in the photoreceptors. Results from the witness samples have been used in defining preferred ranges of sputtering parameters in the inventive method, and while such witness samples are helpful in monitoring the deposition process, they are not essential to practice of said method.

Prevailing conditions during testing of photoreceptors having long dark decays can substantially affect the results obtained. Consequently, testing of the new a-Si:H photoreceptors 10 or 20 was normally done at ambient temperatures of about 22° C., in relative humidities below 40%. Photoreceptor charging in negative polarity was typically done with a coratron comprising a HCL negative corona assembly operating with a 1.2-cm shielded gap, at a charging current of $-225\ \mu a$ through the photoreceptor under test. The photoreceptor was caused to make one pass by the coratron gap at a velocity of 7.6 cm/second. Cross-web surface potentials were recorded over time with an electrostatic voltmeter.

Method Embodiment 4

Series A a-Si:H photoreceptors (10 in FIG. 1) was made using a prior-art laboratory RFSA designed by Vacuum Industries. This system included a reaction chamber pumped with a 450 l/sec turbomolecular pump backed by a mechanical roughing pump. Vacuum levels of $10^{-7}$ Torr were achievable with overnight pumping. As is standard practice, mass flow controllers were used to regulate the flow rates of $H_2$, Ar, and $B_2H_6$/Ar through a manifold and diffuser into the reaction chamber; the total chamber pressure was measured with a capacitance manometer located in the rear of the sputtering chamber. Partial pressures of the process gases were monitored by a residual gas analyzer (RGA) fitted with a pressure-reduction converter, to permit measurement of the partial gas pressures at the sputtering pressure.

The sputtering system included a double-wall, stainless-steel drum 29.9 cm in diameter as a substrate support and was modified to handle 10.2-cm wide web substrates, either as drum wraps for metallic substrates or roll-to-roll around the drum for plastic substrates; the drum was electrically isolated from the apparatus structure. The temperature of the drum was controlled by circulating Dow-Corning diffusion-pump oil between the concentric walls of the substrate drum. The temperature of the oil was controlled by a bath held at the desired temperature. Substrate temperature could thus be varied from room temperature to about 200° C. and was monitored by placing temperature sensitive adhesives on the drum or by using a thermocouple. The double-wall drum was rotated by a variable-speed, reversing drive motor and controller by which the substrate speed could be varied from 0.21 mm/sec to 3 mm/sec.

With reference to FIG. 1 the substrate 12 in this series was a Type 301 stainless steel strip (0.1 mm thick, 10.2 cm wide, and 12.2 cm long) which was wrapped around the support drum and tensioned in place by springs. Positive electrical connection was provided between substrate and support drum.

The a-Si:H photoconductor 14 was sputtered from a commercial silicon sputtering target (99.999% pure silicon) 15.2 cm in diameter (181 $cm^2$ surface area) and about 0.6 cm thick. Mounted vertically and surrounded by a ground shield, the target was cooled by water flowing through its backing plate. A variable power, 700-watt maximum output, RF generator operating at 13.56 MHz was capacitively coupled to the target through a matching choke, a tap on which produced a RF bias on the drum supporting the substrate. Switching means permitted the substitution of a filtered DC bias supply and bias current recorder for the RF bias supply. DC bias currents were recorded, with substrate bias current densities ranging between 0.77 A/m$^2$ and 3.3 A/m$^2$ of target area.

Series A photoreceptors were made according to Photoreceptor Embodiment 2 as follows. After the reaction chamber had pumped down to 10$^{-7}$ Torr, 100% argon (Ar) was admitted, at a flow rate of 20 standard cubic centimeters/minute (sccm); hydrogen gas (H$_2$) was admitted at the flow rate needed to give the required concentration, as determined by RGA, at the desired total chamber pressure P. The latter was set by varying the effective chamber pumping rate, by adjusting the gate valve opening. The dopant, boron as diborane (B$_2$H$_6$) in argon, was admitted to the chamber with a flow concentration equal to the partial pressure concentration, since the partial pressure of diborane was far below the sensitivity limits of the RGA. Flow of cooling water to the target was started, and the plasma ignited by either a pressure burst or a pulsed filament. Presputtering was then done for 15 to 30 minutes over the ends of the static substrate while the chamber gas composition was monitored. Once stable chamber conditions were attained, drum rotation was started and a layer of a-Si:H approximately one micron in thickness was deposited while the partial pressure of Ar gas and H$_2$ gas were recorded by RGA. An emission spectrometer was used to monitor the spectral lines of Ar and H$_2$, as well as of silicon, through a quartz window in the vacuum chamber. All Series A photoreceptors were deposited under the conditions summarized in Table I.

TABLE I

Sputtering parameters for Series A a-Si:H photoreceptors.

| Parameter | Value |
| --- | --- |
| H$_2$ partial pressure, P$_H$ | 3.6 mTorr |
| Ar partial pressure, P$_{Ar}$ | 8.4 mTorr |
| Total pressure, BP | 12 mTorr |
| B$_2$H$_6$ dopant | 15 ppm |
| Total gas flow | 30 sccm |
| Target voltage, V$_T$ | −1,430 volts |
| Target forward power | 200 watts |
| Target power density, PD | 1.1 watts/cm$^2$ |
| Substrate temperature | 160° C. |
| Substrate speed | 0.72 mm/sec |
| Substrate bias, V$_B$ | +40 to −100 volts |
| Bias current density | .77 to 3.3 A/m$^2$ |

All parameters being held constant except for the substrate DC bias conditions. The ratio (P$_H$/R$_{Si}$) was controlled at approximately 4.4 mTorr·hr/micron as determined by experimental work, to give optical bandgaps of approximately 2.0 at the indicated target voltage V$_T$. Once the desired thickness of a-Si:H was deposited, the target power source and gases were turned off, the gas valve opened to remove reaction products, the target coolant was turned off, and the reaction chamber vented with nitrogen. The photoreceptor was removed and replaced with a new substrate, and the substrate temperature was adjusted as necessary for the next deposition. Upon removal of the photoreceptor from the sputtering chamber, the substrate ends positioned adjacent to the target during the presputtering period were removed and discarded, and three sets of samples 2.54 cm in diameter were punched from each photoreceptor.

The three sets of a-Si:H samples were analyzed for the atomic percentage of implanted argon, the electrical dark resistivity, and the dark decay, respectively. Implanted argon was determined by energy-dispersive x-ray analysis on one set of samples, while room-temperature dark resistivity was determined by current-voltage measurements between aluminum contacts evaporated onto the second set of samples. Results from these determinations are given in Table II. The amount of implanted Ar approximately doubles as the substrate potential V$_B$ decreases from +40 volts to −60 volts, while the dark resistivity increases by approximately four orders of magnitude. For substrate bias potentials V$_B$≦−40 volts, the dark resistivities were too high for accurate measurement.

TABLE II

Properties of Series A a-Si:H photoreceptors.

| Bias, V$_B$ (volts) | Ar (at %) | Resistivity (ohm · cm) | V$_{105}$ (volts) |
| --- | --- | --- | --- |
| +40 | 2.60 | 2.4 × 10$^{10}$ | 0 |
| +20 | 2.46 | 3.5 × 10$^{12}$ | 0 |
| +5 | 3.30 | 1.3 × 10$^{13}$ | 0 |
| −20 | 5.71 | 2.5 × 10$^{13}$ | −2 |
| −40 | 5.09 | >10$^{14}$ | −12 |
| −60 | 5.34 | >10$^{14}$ | −14 |
| −100 | 4.31 | >10$^{14}$ | −8 |

The third set of samples was passivated by heating to 130° C. overnight and then allowing them to age for several days in ambient atmosphere. The resultant bilayer photoreceptors constitute doped examples of the above-described Photoreceptor Embodiment 2 illustrated in FIG. 1. This set of samples was then negatively charged with a constant-current coratron and the dark decay monitored with an electrostatic voltmeter. For each a-Si:H layer the surface potential V$_{105}$, measured 105 seconds after the coratron was turned off, is also given in Table II. It can be seen that the novel a-Si:H material resulting from the present method as practiced in a laboratory sputtering reactor retains surface potentials useful in electrophotography for significantly longer periods than do prior-art a-Si:H photoconductors as shown in U.S. Pat. No. 4,265,991, when substrate potential V$_B$ is held above approximately −40 volts during deposition of the a-Si:H layer. Because of the boron doping, Series A photoreceptors displayed bichargeable properties.

Optical bandgaps for the Series A a-Si:H photoreceptors ranged between 1.98 eV and 2.02 eV. Of the photoreceptors for which properties are summarized in Table II, the one made at a substrate potential of +20 volts contained the largest amounts of hydrogen bonded in the monohydride mode; photoreceptors made at other bias conditions contained larger amounts of hydrogen bonded in the dihydride mode, particularly for substrate potentials of approximately V$_B$≦−40 volts. The trends in dark resistivity and dark decay reflected in Table II track the trend of increased non-monohydride bonding modes as substrate bias potential decreases towards −100 volts. Imaging experiments were also carried out with other samples of Series A photoreceptors formed at substrate potentials in the range between −60 volts and −100 volts. For relative humidities below about 40%, these photoreceptors were found to yield high-resolution, high-quality images when used with imaging processes and liquid toning systems compatible with cadmium sulfide photoreceptors.

Method Embodiments 5 Through 7

Thin a-Si:H photoreceptors (10 or 20 in FIGS. 1 or 2) were made using a RFSA capable of handling 40-inch wide web substrates either as drum wraps or roll-to-roll. Described in U.S. Pat. No. 3,905,887 and illustrated schematically in FIG. 3, this sputtering system 32 consists of a vacuum chamber 34 surrounding a stainless-steel drum 36 which can be rotated about its axis 38. Drum 36 is 106.7 cm both in length and diameter, is electrically isolated from chamber 34, and acts as the support for substrate 12. Heated oil was circulated through drum 36 to maintain it, and therefore the substrate 12, at a predetermined temperature typically in the range between 100° C. and 110° C. Four pure (99.99%) polycrystalline silicon targets 42, 44, 46, and 48, each 12.7 cm wide by 106.7 cm long by 1.27 cm thick (5,420 cm$^2$ total surface area), were mounted in the chamber walls around drum 36, which was rotated during sputtering to move substrate 12 under each target 42, 44, 46, and 48 in succession. The substrate 12, a sheet of 5-mil (0.125 mm) thick T430 stainless steel 81.2 cm wide by 322.5 cm long, was wrapped around drum 36 and held in position by springs. Drum 36 was then placed into chamber 34 and chamber 34 was sealed.

Figure 3:
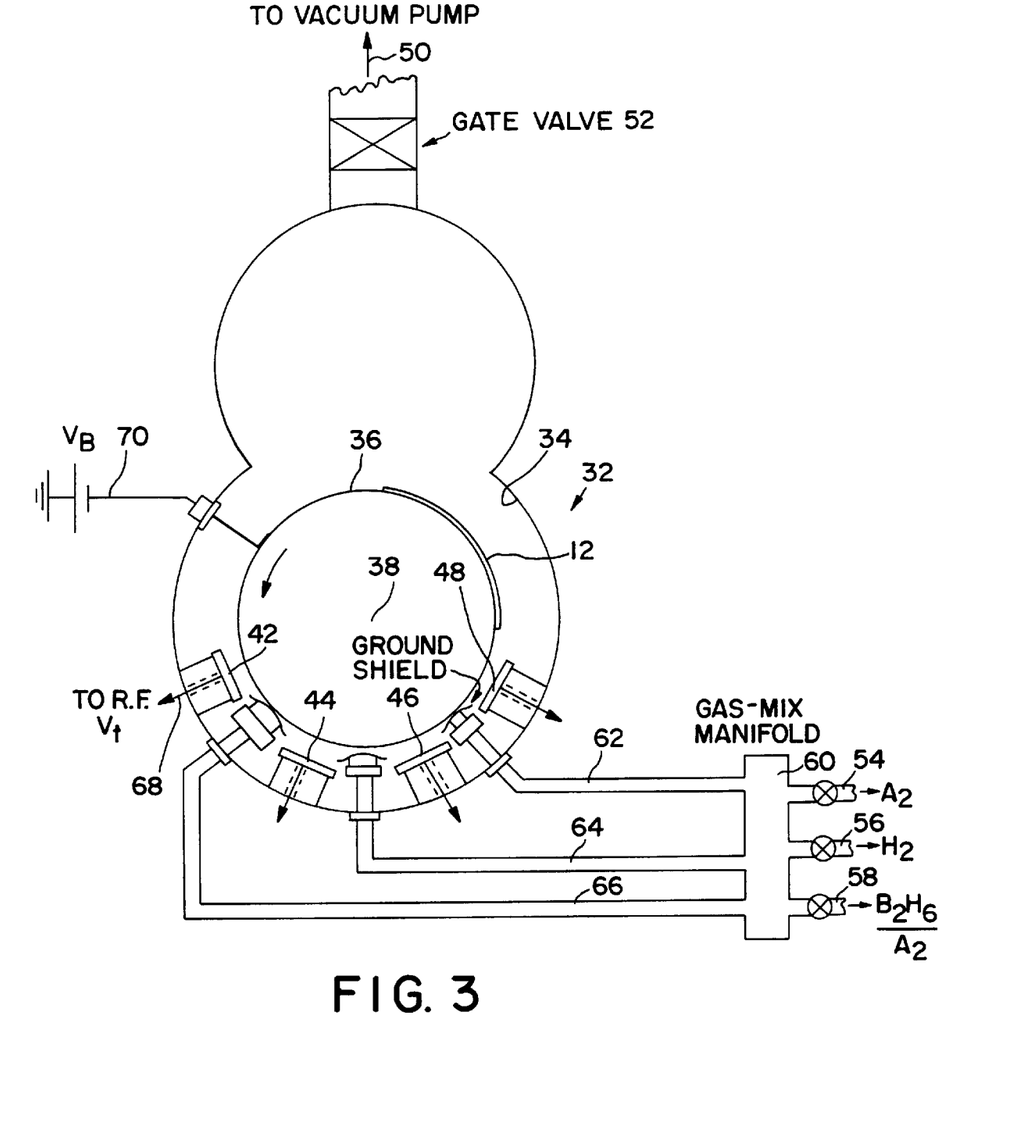
FIG. 3 is a schematic diagram of a radio-frequency diode reactive-sputtering apparatus for performing the method of this invention.

After sealing, chamber 34 was then pumped by standard practices to a base pressure in the low $10^{-6}$ Torr range through port 50 and gate valve 52 and held at this pressure overnight. Chamber 34 was then backfilled with argon (Ar) from source 54, hydrogen (H$_2$) from source 56, and if required diborane (B$_2$H$_6$) from source 58 through mixer manifold 60 and respective lines 62, 64, and 66 until the predetermined gas partial pressures and total chamber pressure were reached. Total chamber pressure was maintained via a baratron pressure meter controlling a throttle valve (not shown). Individual gas partial pressures were determined with a residual gas analyzer and adjusted using flow controllers. Once the desired total pressure and gas mixture were attained in chamber 34, RF power was applied to targets 42, 44, 46, and 48 from a capacitively-coupled 13.56 MHz source 68, and the plasma ignited. System 32 was allowed to presputter for 30 minutes with the stationary drum 36 positioned so that the overlapping ends of substrate 12 were located between the inner pair of targets, 44 and 46. A DC power supply 70 was used to apply a predetermined bias potential to drum 36, and therefore the substrate 12, during the deposition process.

To start the actual deposition of the a-Si:H photoconductor, the RF power from power source 68 was adjusted to the desired level (typically to provide $V_T = -1.5$ kvolts), and drum 36 was rotated at a predetermined speed. The ratio ($P_H/R_{Si}$) was controlled in the range between approximately 3.6 mTorr·hr/micron and 6.1 mTorr·hr/micron as determined by previous experimental work, to give optical bandgaps of approximately 2.0 at the selected target voltage $V_T$. Bias conditions were set by appropriately controlling the potential and current provided by the bias power source 70. Drum 36 was allowed to make a predetermined number of complete revolutions while all sputtering parameters, including substrate bias potential and current, were monitored. Thickness of the a-Si:H layer was controlled by regulating the number of revolutions and rotational speed of the drum 36. Once deposition of the photoconductor was completed, RF power source 68 and DC bias source 70 were was turned off, the gas valves were closed, the gate and throttle valves were opened, and chamber 34 was pumped to a pressure of $10^{-5}$ Torr. Gate valve 52 was then closed, and the chamber 34 was backfilled with dry nitrogen (N$_2$) prior to removal of the photoreceptor.

On removal of each photoreceptor from the RFSA, that portion located over the targets during the presputter period was removed and discarded. The remainder of substrate 12 was cut into several cross-web strips 10 cm wide by 80 cm long and plates 52 cm wide by 63 cm long to form the finished photoreceptors 10 or 20 of FIGS. 1 or 2. Prior to evaluation the bilayer photoreceptors were all given a post-deposition passivation treatment. The strips were used to determine electrophotographic properties such as charge acceptance $V_0$, dark decay $\tau_D$, photosensitivity, and spectral sensitivity. The plates were used to evaluate imaging properties by preparing color proofs on an unmodified color proofing system (U.S. Pat. Nos. 4,358,195 and 4,269,919) adapted to charge and tone prior-art cadmium sulfide photoreceptors.

Based on the results obtained with the laboratory RFSA, a trial series of a-Si:H photoconductive layers was deposited with the production RFSA 32. The target voltage $V_T$ was held at −1.5 kvolts, the total gas flow was held at 400 sccm, and deposition was limited to eight drum rotations. Substrate temperature was varied over the range from 100° C. to 160° C., and substrate bias was varied over the range suggested by results from the laboratory system, −40 volts to −100 volts. The ratio of ($P_H/R_{Si}$) =4.4 mTorr·hr/micron was selected to give an estimated optical bandgap of approximately 2.0 eV. Contrary to the prior art, it was found that with the method of the present invention, substrate temperatures over the range of 100° C. to 160° C. had substantially no effect on the photoconductive quality of a-Si:H layers demonstrating the desired high dark resistivities and long dark decays. Sputtering parameters for a-Si:H layers deposited at 100° C. are summarized in Table III; here, it is shown that H$_2$ flows of approximately 45 to 48 sccm, at total reactor pressures of 16 mTorr, and substrate bias potentials of approximately −80 volts produce photoreceptors approximately one micron thick having useful surface potentials at 105 seconds after charging. In particular, the photoreceptors deposited at substrate bias potentials of −80 volts and −90 volts had dark electric-field strengths after 105 seconds $E_{105}$ of 19.9 volts/micron and 22.4 volts/micron, respectively.

TABLE III

Sputtering parameters for production RFSA and properties of trial photoreceptors

| Bias, $V_B$ (volts) | PD (watts/cm$^2$) | BP mTorr | H$_2$ (at %) | Ar flow (sccm) | H$_2$ flow (sccm) | Thick (nm) | Bandgap (eV) | $V_{105}$ (volts) |
|---|---|---|---|---|---|---|---|---|
| −60 | 0.756 | 16 | 12.8 | 385.0 | 15.0 | | | |
| −80 | 0.646 | 10 | 20.2 | 380.0 | 20.0 | | | |
| −80 | 0.691 | 13 | 26.4 | 367.0 | 33.0 | | | |

TABLE III-continued

Sputtering parameters for production RFSA and properties of trial photoreceptors

| Bias, $V_B$ (volts) | PD (watts/cm²) | BP mTorr | $H_2$ (at %) | Ar flow (sccm) | $H_2$ flow (sccm) | Thick (nm) | Bandgap (eV) | $V_{105}$ (volts) |
|---|---|---|---|---|---|---|---|---|
| −80 | 0.756 | 16 | 34.9 | 352.0 | 48.0 | 1105 | 1.98 | −22.0 |
| −80 | 0.691 | 13 | 43.6 | 343.0 | 57.0 | | | |
| −80 | 0.627 | 10 | 55.3 | 330.0 | 70.0 | | | |
| −90 | 0.775 | 16 | 37.3 | 355.0 | 45.0 | | | |
| −40 | 0.756 | 16 | 35.2 | 355.0 | 45.0 | 976 | 2.01 | −0.5 |
| −60 | 0.756 | 16 | 35.2 | 355.0 | 45.0 | 1008 | 1.99 | −1.5 |
| −90 | 0.738 | 16 | 35.3 | 355.0 | 45.0 | 1160 | 1.99 | −26.0 |
| −100 | 0.811 | 16 | 35.6 | 355.0 | 45.0 | 1155 | 1.97 | −12.0 |

Three series of a-Si:H photoreceptors were made using the production RFSA 32 as described above and various sputtering conditions. In the first such series, Series B, additional photoreceptors were deposited at the conditions yielding the photoreceptors for which the bandgap and $V_{105}$ data are given in Table III. For these photoreceptors, all sputtering conditions were held constant except for substrate bias potential and current. The second such series, Series C, was similar to Series B except for addition of approximately 0.1 ppm of diborane. In the third such series, Series D, all photoconductive layers were deposited under fixed-bias potential (−80 volts), with 1.7 sccm diborane flow and varying target voltage $V_T$. The sputtering conditions for Series B, Series C, and Series D photoreceptors are summarized in Table IV. Substrate speed for all series was approximately 7.5 mm/sec. Series B photoreceptors were deposited over eight drum rotations and ranged between 0.9 micron and 1.1 micra in a-Si:H thickness, while Series C and Series D photoreceptors were deposited over 12 drum rotations and ranged between 1.3 micra and 1.45 micra in a-Si:H thickness. All photoreceptors in these three series were formed at a substrate temperature of 100° C. Prior to evaluation all photoreceptors were given a post-deposition passivation treatment, described in the individual Method Embodiments.

TABLE IV

Sputtering parameters for Series B, Series C, and Series D a-Si:H photoreceptors.

| Parameter | Series B | Series C | Series D | Units |
|---|---|---|---|---|
| $H_2$ partial pressure, $P_H$ | 5.6 | 5.5 | 5.5 | mTorr |
| $H_2$ | | 52.3 to 56.3 | 56 | at % |
| Ar partial pressure, $P_{Ar}$ | 10.4 | 4.5 | 4.5 | mTorr |
| Total pressure, BP | 16 | 10 | 10 | mTorr |
| $B_2H_6$ dopant | 0 | 0.1 | 0.34 | ppm |
| $B_2H_6$ gas flow | 0 | 0.5 | 1.7 | sccm |
| $H_2$ gas flow | 48 to 45 | 85 | 90 | sccm |
| Ar gas flow | 352 to 355 | 315 | 310 | sccm |
| Total gas flow | 400.0 | 400.5 | 401.7 | sccm |
| Target voltage, $V_T$ | −1.50 | −1.50 | −1.51 to −1.53 | kvolts |
| Target forward power | 4.0 to 4.4 | 3.5 to 3.8 | 3.8 to 4.9 | kwatts |
| Target power density, PD | 0.74 to 0.81 | 0.65 to 0.70 | 0.70 to 0.90 | watts/cm² |
| Drum rotations | 8 | 12 | 12 | revolutions |
| Substrate bias, $V_B$ | 0 to −100 | 0 to −80 | −80 | volts |
| Bias current density | 0.2 to | 0.7 to | 0.9 to 3.1 | A/m² |

TABLE IV-continued

Sputtering parameters for Series B, Series C, and Series D a-Si:H photoreceptors.

| Parameter | Series B | Series C | Series D | Units |
|---|---|---|---|---|
| | 3.6 | 3.4 | | |

Method Embodiment 5

A series of a-Si:H photoreceptors (10 in FIG. 1) was made using the production RFSA 32 as described above and the sputtering parameters given for Series B in Table IV. To better exhibit the undoped properties of the novel a-Si:H photoconductors, one such passivation treatment consisted of heating portions of the photoreceptors in series B to approximately 130° C. for several (3 to 12) hours and then allowing them to equilibrate with the ambient atmosphere for several days. The resultant undoped bilayer photoreceptors constitute examples of the above-described Photoreceptor Embodiment 1 illustrated in FIG. 1. Surface potentials $V_{105}$ measured 105 seconds after charging for a-Si:H photoreceptors so heat treated are indicated by the subscript HT in Table V. The dark electric-field strength after 105 seconds was $E_{105}$=16.3 volts/micron for the photoreceptor deposited at a substrate bias potential of −70 volts, compared to $E_{105}$=14.0 volts/micron and $E_{105}$=8.6 volts/micron for those deposited at substrate potentials of −80 volts and −90 volts, respectively. No significant differences in functional properties of the photoreceptors were found for heat soak times at 130° C. of three hours or greater; heat soak times of 3 to 5 hours are preferable, to minimize energy requirements. The equilibration time also is not critical, but is preferable that a minimum equilibration period of ten days be observed.

Method Embodiment 6

To further demonstrate that the unexpected properties of the a-Si:H photoconductors did not originate in inadvertent topcoating, other samples from each of the photoreceptors in Series B were given an alternative passivation treatment, a post-deposition topcoating consisting of a thin layer of dielectric silicon nitride ($Si_3N_4$). The resultant undoped bilayer photoreceptors 20 constitute examples of the above-described Photoreceptor Embodiment 3 illustrated in FIG. 2. The topcoat may range between 5 nm and 25 nm in thickness without adverse residual effects, but is preferably between 8 nm to 10 nm. Such topcoat is preferably formed before the a-Si:H photoreceptor is removed from the sputtering apparatus. No heat treatment was given to, or found necessary for, the topcoated photoreceptors. Surface potentials $V_{105}$ measured 105 seconds after charging for a-Si:H photoreceptors so topcoated are indicated by the subscript TC in Table V. The dark electric-field strength after 105 seconds was $E_{105}=23.9$ volts/micron for the photoreceptor deposited at a substrate bias potential of −70 volts, compared to $E_{105}=26.4$ volts/micron and $E_{105}=22.4$ volts/micron for those deposited at substrate potentials of −80 volts and −90 volts, respectively.

TABLE V

Properties of a-Si:H photoreceptors in Series B.

| Bias, $V_B$ (volts) | Thickness (nm) | Bandgap (eV) | $(V_{105})_{HT}$ (volts) | $(V_{105})_{TC}$ (volts) |
|---|---|---|---|---|
| 0 | 1139 | 1.98 | 0 | 0 |
| −10 | 1082 | 1.99 | 0 | 0 |
| −20 | 985 | 2.00 | 0 | 0 |
| −30 | 1004 | 2.00 | 0 | 0 |
| −40 | 976 | 2.01 | 0 | 0 |
| −50 | 1019 | 1.97 | 0 | 0 |
| −60 | 1008 | 1.99 | −2 | 0 |
| −70 | 1045 | 1.97 | −17 | −25 |
| −80 | 1059 | 2.01 | −15 | −28 |
| −90 | 1160 | 1.99 | −15 | −26 |
| −100 | 1155 | 1.97 | −7 | −12 |

Method Embodiment 7

A series of a-Si:H photoreceptors was made using the production RFSA 32 as described above and the sputtering parameters given for Series C in Table IV. The six photoreceptors in this series were deposited under conditions similar to those for Series B except for the addition of 0.1 ppm of diborane ($B_2H_6$) gas to the sputtering atmosphere, to produce bichargeable photoreceptors. After passivation by topcoating with silicon nitride (10 nm coating), the photoreceptors (20 in FIG. 2) were negatively charged and their dark decays determined as in previous series. Surface potentials $V_{105}$ measured after 105 seconds are given in Table VI with other photoreceptor properties. Dark electric-field strength after 105 seconds was $E_{105}=15.7$ volts/micron for the photoreceptor deposited at a substrate bias potential of −70 volts, compared to $E_{105}=14.5$ volts/micron that deposited at a substrate potential of −80 volts. These doped photoreceptors constitute other examples of the above-described Photoreceptor Embodiment 3.

TABLE VI

Data for Series C a-Si:H photoreceptors.

| Bias, $V_B$ (volts) | PD (watts/cm²) | $H_2$ (at %) | Thickness (nm) | $V_{105}$ (volts) | Bandgap (eV) |
|---|---|---|---|---|---|
| 0 | 0.682 | 55.6 | 1408 | −2.0 | 2.05 |
| −40 | 0.646 | 54.7 | 1329 | −1.5 | 2.05 |
| −50 | 0.646 | 55.6 | 1322 | −2.5 | 2.08 |
| −60 | 0.664 | 56.3 | 1318 | −14.5 | 2.06 |
| −70 | 0.700 | 52.3 | 1371 | −21.5 | 2.07 |
| −80 | 0.700 | 55.0 | 1447 | −21.0 | 2.06 |

Another series of doped a-Si:H photoreceptors according to the above-described Photoreceptor Embodiment 3 was made using the production RFSA 32 as described above and the sputtering parameters given for Series D in Table IV. The five photoreceptors in this series were deposited at a fixed bias potential $V_B=-80$ volts, under conditions similar to those for Series C except for increased diborane ($B_2H_6$) gas concentration (approximately 0.34 ppm) in the sputtering atmosphere. In this series, the RF power was varied, to determine effects of a-Si:H deposition near breakdown. The target power densities PD and target voltages $V_T$ at which each photoreceptor was formed are given in Table VII. After passivation by topcoating with silicon nitride (10 nm coating), these doped photoreceptors were negatively charged and their dark decays determined as in previous series; surface potentials measured after one second $V_1$, 105 seconds $V_{105}$, and 300 seconds $V_{300}$ are listed in Table VII. The voltage $V_1$ is practically the charge acceptance $V_0$, while $V_{105}$ and $V_{300}$ are indicative of toning potentials for analog and digital proofing processes, respectively. For the nominal a-Si:H thickness of 1.4 micra, these surface potentials correspond to average dark electric-field strengths across the a-Si:H thickness of approximately $E_1=38$ volts/micron, $E_{105}=21$ volts/micron, and $E_{300}=17$ volts/micron, respectively. Also included in Table VII are calculated data relevant to both analog and digital electrophotographic color proofing applications, i.e., the fractional surface potential decay for both 105-second and 300-second delays between photoreceptor charging and potential measurement and the potential drop between measurements made at 105 and 300 seconds. It can be seen that a-Si:H photoreceptors made according to the new method provide more than sufficient surface potential to enable their use in even the most demanding electrophotographic applications. In addition, the data of Table VII illustrate that over the range of power densities used in making Series B and Series C, extended to approaching breakdown, i.e., from 0.70 watts/cm² to 0.90 watts/cm², consistent photoconductive properties are attained at substrate bias conditions according to the inventive method.

TABLE VII

Data for Series D a-Si:H photoreceptors

| PD (watts/cm$^2$) | Target, kvolts | $V_1$ (volts) | $V_{105}$ (volts) | $V_{300}$ (volts) | 1 - $V_{105}/V_1$ | 1 - $V_{300}/V_1$ | $V_{105}$–$V_{300}$ (volts) |
|---|---|---|---|---|---|---|---|
| 0.700 | −1.51 | −52.2 | −29.5 | −23.5 | 0.43 | 0.55 | −6.0 |
| 0.811 | −1.53 | −55.6 | −31.3 | −23.9 | 0.44 | 0.57 | −7.4 |
| 0.830 | −1.52 | −49.2 | −28.7 | −23.1 | 0.42 | 0.53 | −5.6 |
| 0.886 | −1.51 | −55.1 | −29.2 | −24.0 | 0.47 | 0.56 | −5.2 |
| 0.904 | −1.52 | −55.0 | −28.8 | −23.6 | 0.48 | 0.57 | −5.2 |

The proofing system of U.S. Pat. Nos. 4,358,195 and 4,556,309 and liquid toners, both proofing system and toner system being optimized for use with cadmium sulfide photoreceptors, were used to test the electrophotographic quality of the new a-Si:H photoreceptors. Photoreceptors produced with substrate bias potentials in the range between −60 and −90 volts and bias current densities in the range of preferred current densities yielded high-quality, high-resolution, final images when substituted for the cadmium sulfide photoreceptors. The images are comparable to those yielded by the cadmium sulfide photoreceptors and should be useful in various electrophotographic applications such as printing, plate making, duplicating, or color proofing, among others. Photoreceptors produced at bias potentials outside a range between −60 volts and −90 volts fail to image under the test conditions, regardless of the bias current density. The long dark decays attainable with method of the invention make the novel photoreceptors well suited to digital imaging processes such as described in U.S. Pat. No. 4,428,000.

While not desiring to be bound by any theory of the invention, it is believed that the novel material's attractive electrophotographic properties are determined by structural and compositional inhomogeneities created in it as a direct result of the above-described deposition method, and that these inhomogeneities give rise to trapping states whose density is unexpectedly controlled by novel substrate bias potentials and current densities during a-Si:H deposition under conditions optimized for low densities of thermally generated carriers. It is further believed that the trapping states reduce the effective mobility of the thermally generated carriers, producing a photoconductive material with a high electrical dark resistivity and long electrophotographic dark decay. It is thought that these beneficial effects may be achieved by a combination of several factors operating under the substrate negative-bias conditions herein described. As has been noted, prior-art negative-bias conditions have been considered to be deleterious, since they lead to hydrogen etching of the developing a-Si:H layer, backsputtering of the Si:H layer by Ar$^+$ ions, or in increased incorporation of argon into the layer. However, under the sputtering regime established by the bias conditions disclosed herein, it is believed that these mechanisms contribute to the attractive electrophotographic properties of the resulting a-Si:H material. Important to these properties are thought to be the limitation to low levels (approximately 4 at%) of hydrogen incorporation in the developing layer, the use of RF powers near breakdown, and the levels of argon implantation (preferred to be in the range of 4 to 6 at%).

As in the prior art, a-Si:H deposition proceeds as Si atoms removed from the target alloy with hydrogen in the sputtering atmosphere and coalesce onto the substrate. Si atoms may be sputtered off the target either singly as Si$^+$ ions or in charged clusters of a few Si atoms, possibly retaining the tetrahedral structure found in the target. At high RF powers, the latter is thought to be favored, and the Si$^+$ ions and charged Si clusters, the H$^+$ ions, and the Ar$^+$ ions arriving at the substrate are highly energetic; with the applicant's bias conditions, the energy level of these positively-charged species is thought to be modulated and controlled by the substrate bias potential, while their arrival density is thought to be modulated and controlled by the substrate bias current density. Hydrogen etching may operate to keep a constantly reactive surface available to the Si$^+$ ions and Si clusters, the latter of which may operate to bridge incipient interstitials forming at the edges of coalescing nucleation islands of deposited a-Si:H. Bombardment by Ar$^+$ ions may further this process by operating to backsputter loosely bonded Si$^+$ ions and Si clusters. At the preferred substrate potentials of this invention, the energy levels of arriving Ar$^+$ ions are thought to be above the implantation level, but the degree of argon implantation is limited by the level of argon in the sputtering atmosphere and by the preferred range of substrate bias-current densities. While the refractive indices of the a-Si:H layers in the present invention compare favorably with those of prior-art glow-discharge layers, data indicate that there is an appreciable void-volume in the layers. It is thought that in the bias-sputtering method used in the present invention, the void-volume is distributed as a dense network of nano-voids below the resolution level of SEM, rather than the SEM-resolvable columnar microstructure of a-Si:H layers deposited by prior-art bias-sputtering methods. Such void structures would function at the nano-level as traps, the volumetric density of which would decrease the effective drift mobilities of carriers. Thus, the high dark resistivities and long dark decays of a-Si:H layers formed by the present method might result from either directly decreased drift mobilities, or indirectly from the much longer drift migration distances imposed by the nanovoid network, or both.

Regardless of the degree of correctness of the preceding explanation, the comparable electrophotographic properties of the novel a-Si:H photoreceptors produced on the two quite different RFSA indicate that the method herein described is not substantially apparatus-dependent, but rather is a general one adaptable to a specific apparatus by those skilled in the sputtering art.

In view of the above teachings, many modifications and variations of the present invention are possible and will be obvious to those skilled in the relevant arts. While for electrophotographic applications the present invention is preferably practiced with conductive substrates, it may also be practiced with dielectric substrates as indicated by the witness samples made in each of the Method embodiments. Such dielectric substrates may be desirable for some applications of the new a-Si:H photoconductive material. It is therefore to be understood that, within the scope of the appended claims, the invention may be practiced otherwise than as specifically described.

What is claimed is:

1. A method of making a photoreceptor member comprising a conductive substrate and a photoconductive layer, which method comprises:

a) providing an evacuable chamber with at least one target comprising silicon, said target being electrically insulated from an electrically conductive structure of said chamber;

b) providing said chamber with a substrate support having a heatable substrate-supporting surface and a conductive substrate mounted on said heatable supporting surface, wherein at least a substrate surface is electrically conductive, and wherein said conductive substrate surface or said heatable supporting surface is electrically insulated from said electrically conductive structure of said chamber;

c) reducing the pressure in said chamber and providing a gaseous flow comprising argon and hydrogen atoms into said chamber to form a gaseous chamber atmosphere;

d) capacitively coupling a radio-frequency generator between said target and said electrically conductive structure of said chamber, said generator providing a voltage and operating at a frequency such as to cause said target to develop a direct-current potential with respect to said electrically conductive structure of said chamber;

e) electrically coupling a direct-current power supply between said electrically conductive structure of said chamber and said conductive substrate surface or heatable surface such that said power supply maintains said conductive substrate surface or heatable supporting surface at a direct-current potential with respect to said electrically conductive structure of said chamber while providing a current flow to said conductive substrate surface or heatable supporting surface; and f) forming a photoconductive layer of 5 micra or less in thickness on said substrate by sputter-depositing an amorphous material i) consisting of silicon from said target and ii) further comprising hydrogen atoms from said chamber atmosphere while maintaining the ratio of partial pressure of hydrogen in said chamber atmosphere to a deposition rate of said amorphous material onto said substrate between 2.8 mTorr·hour/$\mu$m and 6.1 mTorr·hour/$\mu$m, said conductive substrate surface or heatable supporting surface being maintained at a direct-current potential between −40 volts and −100 volts, whereby providing a photoreceptor member having dark resistivities of at least $10^{13}$ ohm·cm.

2. The method of claim 1 wherein said conductive substrate surface or heatable supporting surface is provided with a current from 0.50 A to 3.5 A per square meter of total target area.

3. The method of claim 2 wherein said forming of a photoconductive layer is performed by having a target voltage greater than 90% of the breakdown voltage.

4. The method of claim 2 wherein said forming of a photoconductive layer occurs in a chamber atmosphere containing a gaseous dopant material.

5. The method of claim 2 wherein said amorphous material contains less than 5% total hydrogen.

6. The method of claim 1 wherein said forming is at a temperature of between 80° C. to 200° C.

7. The method of claim 1 wherein said forming of a photoconductive layer is at a rate of depositing of said amorphous material of greater than 0.5 micron per hour and wherein said layer has an electric field strength of at least 10 volts per micron thickness 100 seconds subsequent to charging said layer.

8. The method of claim 1 wherein said conductive substrate is formed from a member selected from the group consisting of an alloy of aluminum, an alloy of chromium, an alloy of iron, an alloy of molybdenum, an alloy of nickel, and an alloy of tungsten.

9. The method of claim 1, wherein said conductive substrate is formed from a nonconductive composition coated with a member selected from the group consisting of an alloy of aluminum, an alloy of chromium, an alloy of iron, an alloy of molybdenum, an alloy of nickel, an alloy of tungsten, and ohmic oxides.

10. The method of claim 9, wherein said conductive substrate is formed from a nonconductive composition selected from the group consisting of glass and crystalline silicon, wherein said member is coated with ohmic oxides.

11. The method of claim 1 further comprising coating said photoconductive layer with a top coat of a dielectric material comprising silicon atoms.

* * * * *

UNITED STATES PATENT AND TRADEMARK OFFICE
CERTIFICATE OF CORRECTION

PATENT NO. : 6,197,471B1
DATED : March 6, 2001
INVENTOR(S) : Graham, et al.

It is certified that error appears in the above-identified patent and that said Letters Patent is hereby corrected as shown below:

Column 6,
Line 37, change "a" to -- an --.

Column 10,
Lines 53-54, change "$V_0$=- 40" to -- $V_0 \cong -40$ --.
Line 62, after $E_{105}$ ", change "=" to -- $\cong$ --.

Column 11,
Line 27, after $E_{105}$ ", change "=" to -- $\cong$ --.
Line 62, after $E_{105}$ ", change "=" to -- $\cong$ --.
Line 66, after $E_{105}$ ", change "=" to -- $\cong$ --

Column 14,
Line 28, change "was" to -- were --.

Column 15,
Line 54, change "being" to -- were --.
Line 60, change "gas" to -- gate --.

Column 18,
Line 38, change =-4.4" to -- $\cong 4.4$ --.

Column 19,
Line 57, left column of Table IV, change "$H_{2\ gas\ flow}$" to -- $H_2$ gas flow --.

UNITED STATES PATENT AND TRADEMARK OFFICE
CERTIFICATE OF CORRECTION

PATENT NO. : 6,197,471 B1
DATED : March 6, 2001
INVENTOR(S) : Graham, et al.

It is certified that error appears in the above-identified patent and that said Letters Patent is hereby corrected as shown below:

Column 21,
Line 15, move heading "$(V_{105})_H$" to line 16 and insert it before the "$T$".
Line 15, move heading "$(V_{105})_T$" to line 16 and insert it before the "$C$".

Column 23,
In table headings, under "Target,", change "kvolts" to -- (kvolts) --.

Signed and Sealed this

Twenty-first Day of August, 2001

*Attest:*

*Attesting Officer*

NICHOLAS P. GODICI
*Acting Director of the United States Patent and Trademark Office*